(12) United States Patent
Eskång

(10) Patent No.: US 6,869,040 B2
(45) Date of Patent: Mar. 22, 2005

(54) METHOD, SYSTEM AND ARRANGEMENT FOR HANDLING COMPONENT TAPES

(75) Inventor: Eric Eskång, Sollentuna (SE)

(73) Assignee: Mydata Automation AB, Bromma (SE)

( * ) Notice: Subject to any disclaimer, the term of this patent is extended or adjusted under 35 U.S.C. 154(b) by 208 days.

(21) Appl. No.: 10/235,547

(22) Filed: Sep. 6, 2002

(65) Prior Publication Data

US 2003/0046808 A1 Mar. 13, 2003

(30) Foreign Application Priority Data

Sep. 7, 2001 (SE) ............................................... 0102977

(51) Int. Cl.⁷ .......................... B65H 16/02; B65H 23/28
(52) U.S. Cl. ................. 242/560; 242/594.2; 242/594.6; 242/566; 242/615.3; 156/584; 156/344; 206/394; 206/714
(58) Field of Search ............................ 242/560, 594.2, 242/594.3, 594.4, 594.5, 594.6, 588.2, 566, 615, 615.3; 156/584, 344; 206/391, 394, 713, 714, 715, 716, 717

(56) References Cited

U.S. PATENT DOCUMENTS

| | | | |
|---|---|---|---|
| 4,819,699 A | 4/1989 | Brown et al. | 140/105 |
| 4,820,369 A | 4/1989 | Kubo | 156/344 |
| 5,077,890 A | 1/1992 | Babington | 29/832 |
| 5,299,902 A | * 4/1994 | Fujiwara et al. | 414/416.01 |
| 6,047,874 A | * 4/2000 | Asai et al. | 226/110 |
| 6,402,452 B1 | 6/2002 | Miller et al. | 414/412 |
| 6,619,526 B1 | 9/2003 | Souder, Jr. | 226/151 |

FOREIGN PATENT DOCUMENTS

| | | |
|---|---|---|
| EP | 0 967 849 A2 | 12/1999 |
| WO | WO 00/38491 A1 | 6/2000 |
| WO | WO 00/38492 A1 | 6/2000 |

OTHER PUBLICATIONS

Copy of brochure of Europlace Industries (Publication Date Jan. 7, 1994).
Copy of homepage printout from Europlace, "Programmable Tape Trolley" date unknown.

* cited by examiner

Primary Examiner—John M. Jillions
(74) Attorney, Agent, or Firm—Birch, Stewart, Kolasch & Birch, LLP

(57) ABSTRACT

A method, a system and an arrangement for handling component tapes in connection with mounting components onto circuit boards in a component mounting machine are disclosed, which utilizes a carrier for carrying component tapes. Each component tape is held by a component tape reel. The component mounting machine utilizes component magazines from which components, carried by the component tape, are supplied for use in a mounting process of the component mounting machine. The component tape of each component tape reel is loaded into a tape guide for guiding the component tape in the component mounting machine, and the component tape reels are arranged in the carrier, which thereaft is placed in the magazine. The tape guides are then mounted in the magazine such that the component tape loaded therein may interact with feeding devices provided in the magazine. Thereby, the magazine is loaded with components and prepared for the ensuing mounting process.

26 Claims, 12 Drawing Sheets

METHOD, SYSTEM AND ARRANGEMENT FOR HANDLING COMPONENT TAPES

TECHNICAL FIELD OF THE INVENTION

The present invention generally relates to the field of manufacture and assembly of circuit boards. More specifically, the present invention relates to a method, a system and an arrangement for handling component tapes for use in the process of mounting of components on circuit boards.

TECHNICAL BACKGROUND

Generally, within the field of manufacture and assembly of circuit boards, electronic components are fed to a component mounting machine for mechanically and/or electrically mounting the components onto a circuit board. These surface mounted components are often delivered spaced apart along the length of a component tape. Generally, two different types of component tapes are used. The first type consists of a lower carrier tape, preferably plastic, provided with component holding compartments, which are enclosed by a separable, thin, plastic upper cover, or cover tape or protective tape. The second type consists of a cardboard body provided with through holes. The body is provided with separable, thin, plastic, top and bottom cover tapes, thus forming component compartments with the through holes. For ease of description, the term cover tape will hereinafter refer only to the top cover.

After having positioned the electronic components in their corresponding compartments, the cover tape is attached to the carrier tape, and the component tape is wound on a component tape holder, which within the art generally consists of a component tape reel. The attachment of the cover tape to the carrier tape can, for instance, be performed by providing either or both of the cover tape and the carrier tape with adhesive areas, or by fusing the cover tape to the carrier tape. Then, the component holder is transferred to a component mounting machine, which feeds a component to a certain predetermined picking position where it can be picked, or collected, by a pick-up head.

According to a method conventionally used within the art, the loading of a component tape in a component mounting machine involves the following steps. Placing the component tape reel into the reel holder of a component mounting machine, or into a tape magazine of a component mounting machine; introducing the free end of the component tape into a feeding mechanism, provided in the machine or in the magazine, such that feeding pins engage corresponding holes provided in the component tape; separating, by hand, the end of the cover tape from the end of the carrier tape for a distance sufficient for the cover tape to be engaged with a cover tape handling device, generally a bobbin onto which the cover tape can be wound; and lowering a locking mechanism over the carrier tape for holding the carrier tape against the feeding mechanism.

Another method that also has been suggested involves, briefly, the steps of loading a component tape of a component tape reel into a tape guide, placing the component tape reel into the reel holder of a component mounting machine or into a magazine, and mounting the tape guide into the machine and/or the magazine.

In both these methods, the magazine or the portion of the component mounting machine into which a component tape to be used in a mounting process is loaded must be idle during the loading process. If a large number of component tapes are to be loaded, the idle time may be significant.

SUMMARY OF THE INVENTION

Thus, an object of the present invention is to provide an improved and more effective method and system for handling component tapes in connection with the mounting of components on circuit boards.

This and other objects are achieved according to the present invention by providing a method and a system having the features defined in the independent claims. Preferred embodiments are defined in the dependent claims.

For the purposes of clarity, the term component tape holder as used herein refers to a device that carries or contains a component tape provided with components. Generally, the component tape holder is a tape reel on which the component tape is wound.

Thus, the present invention is based on the insight of providing a carrier with the ability to carry a plurality of component tape holders, each carrying a component tape, and the ability to be readily and exchangeably placed or mounted in a component magazine. Thereby, the carrier(s) may in advance be fitted with the component tape holders and, thereby, the components to be used in a following component mounting operation, such that the time-consuming placement and loading of each separate component tape holder in a magazine is efficiently avoided.

As used herein, the term carrier refers to a portable device, for holding and carrying a plurality of component tape holders, that is light in weight and easy to carry and to handle. Thereby, the carrier can be fitted with a plurality of tape holders, and subsequently brought to a component magazine when the components then provided in the carrier is required for mounting in a component mounting process. Preferably, and to facilitate handling thereof, the carrier is provided with at least one handle.

It should be noted that the carrier is to be used in conjunction with a component magazine, not instead of a magazine. Thus, the carrier is not provided with any devices for feeding the carrier tape towards a picking position, nor with any locking or coupling elements for direct engagement with a component mounting machine.

In a preferred embodiment of the invention, the carrier has the general shape of a basket, i.e. as an essentially rigid container (or bin) provided with at least one handle. Thereby, the carrier is easy to handle, both when the carrier is carrying component tapes and when it is empty. As understood by the skilled man, other shapes for the carrier may also be contemplated, such as the carrier having the essential shape of a tray, or the like.

Furthermore, in order for carriers to be easily stored together with other carriers, the facing surfaces of carriers positioned adjacent one another are planar and preferably vertical. Furthermore, the carrier is preferably provided with a substantially rectangular base outline. Thereby, a plurality of carriers may be compactly stored next to one another, such that the storage space for the stored carriers may be utilized in an efficient manner.

According to preferred embodiments of the invention, the carrier is provided with a number of separate positions for storing the component tape holders. Preferably, these positions are defined by separate compartments, or sections or cells, one for each component tape holder, the compartments preferably being separated by intermediate walls, or the like. Thus, each component tape holder is effectively kept in place and the component tape holders carried by the same carrier will not interfere with one another. The design of each compartment is preferably such that the component tape holder for which it is intended has a certain degree of mobility within the compartment. Thereby, as an example, a component tape holder in the shape of a reel may rotate within the compartment during feeding of the component tape thereof. It should be noted, however, that other designs are conceivable within the inventive concept. For instance, the component tape holders may be positioned next to one another within a carrier without intermediate walls for separating the holders.

Furthermore, the design of each carrier is, according to a preferred embodiment, adapted to the design of the component tape holders. In other words, each carrier is preferably adapted to receive and carry a component tape holder of a specific design and size. As an example, the diameter as well as the width of the component tape holders may vary. According to a further embodiment, a carrier may be adapted for carrying component tape holders of more than one design or dimension. Alternatively, the carriers may be modifiable for receiving component tape holders of different designs, e.g. the compartments or positions for holding the individual component tape holders may be varied in size. As realized by the man skilled in the art, any combination of these alternatives are of course also conceivable without departing from the inventive concept.

According to the invention, the carrier is made rigid while still being light in weight, which thereby makes the carrier easy to handle and carry. This can be made by manufacturing the carrier from a material that is light in weight, such as aluminum or a plastic material. However, the carrier preferably has a slender design, which enables the use of materials such as stainless steel while still obtaining a carrier that is light in weight and easy to handle and carry.

As stated above, the provision of carriers entails that the placement and loading of each separate component tape holder in a magazine is efficiently avoided. According to the invention, this may be accomplished in a particularly advantageous manner in co-operation with specially designed tape guides, which are arranged for bringing the component tape in position for feeding and for picking of the component. Thus, the tape guide constitutes part of the interface between the component tapes, and the feeding and picking devices of a component mounting machine.

Preferably, each tape guide is arranged for receiving and guiding one component tape. Upon use of the tape guide, the free end of a component tape held by a component tape holder is loaded into the tape guide. The tape guide is arranged to be readily mounted to and removed from a component magazine. In the preferred embodiment described below with reference to the accompanying drawing, the loading and unloading of a tape guide, and consequently of a component tape, in a component magazine is performed within seconds.

In a mounted position, the tape guide then acts to position the component tape in a position for interaction with a feeding device. According to the preferred embodiment, these feeding devices are provided in the component magazine and not in the tape guide. In fact, the tape guide preferably contains no part of the actual feeding mechanism at all. Thereby, the tape guide may be made very small and light in weight. In the preferred embodiment, the width of the tape guide only just exceeds the width of the component tape. However, interacting parts of the feeding arrangement may be provided in the tape guide without departing from the inventive concept.

Furthermore, the tape guide acts to bring the component in a position for picking. According to the most preferred embodiment, this is accomplished by an exposure device provided on the tape guide for exposing the component to be picked at the picking position. A preferred embodiment of a tape guide in accordance with the present invention is disclosed in the international patent publication WO 00/38491, which hereby is incorporated by reference. However, a component exposing device that is not provided solely in the tape guide is conceivable within the inventive concept.

According to preferred embodiments of the invention, the tape guides, and the component tapes loaded therein, can be received and held by the carrier. This is either performed by arranging the component tape holders for holding the tape guides, which holders in turn are held by the carrier, or by arranging the carriers for directly holding the tape guides. As a preferred example, this is made by making the width of the tape guides such that they fit between the opposing wheels in a component tape reel. Alternatively, the component tape holder and/or the tape guide may be provided with suitable holder(s) for attaching them to one another.

In the alternative embodiment where the tape guide is directly held by the carrier, the carriers may preferably be provided with compartments or the like in which the tape guides may be accommodated. Such a compartment could, for example, accommodate substantially the entire tape guide. Alternatively, such a compartment could have the shape of a slot that is arranged to receive and hold only a part of the tape guide, such as a handle or some other projecting portion. Furthermore, each compartment of the carriers could be arranged to accommodate a plurality of tape guides or a single tape guide.

According to a further alternative embodiment, a tape guide grouping handle is provided for grouping a plurality of tape guides and for facilitating the joint handling thereof. Thereby, following the loading of component tapes into a number of tape guides, the tape guides may be jointly mounted in a single action into their respective positions in the magazine by using the grouping handle. The grouping handle is preferably a separate unit, but may alternatively be connected to the carrier.

According to a specific embodiment of the invention, the carriers are arranged for holding the tape guide in a mounted arrangement. As an example, the tape guides may be pivotally mounted in the carriers, such that the tape guides are pivoted into their respective positions in the magazine following the placement of the carrier in the magazine. In a further example, the tape guide could be mounted to the carrier via a flexible attachment, such as a flexible arm or the like. The tape guide could then be manipulated in order to attach the tape guide to the magazine, while still being mounted to the carrier. This arrangement may be suitable if the positions in the magazine into which the tape guides are to be positioned are spaced apart from the position of the carrier in the magazine. Other variants of attachment, detachable or not, between the tape guide and the carriers are conceivable within the inventive concept.

According to the invention, the tape guides are preferably loaded with component tapes on a component tape holder before placing the component tape holder in a carrier. Then, the component tape holder and the corresponding tape guide can be regarded and handled as a single separate unit, interconnected by the component tape. Thereby, the time spent on the actual loading of the tape guides and the corresponding component tapes in the carriers may be significantly reduced. However, in the embodiment where the tape guides are undetachably mounted to the carriers, the loading of the tapes into the tape guides is naturally performed at the carriers.

By providing a carrier with the ability to be provided with component tapes prior to being placed or inserted in the magazine, which, in turn, is inserted or placed in a component mounting machine, a reduced down-time of the machine, and, thereby, an improved time efficiency of the entire manufacturing process is achieved. This is due to the fact that the time-consuming process of separately loading a plurality of component tapes in a magazine is reduced to simply arranging tape holders in a carrier, placing the carrier in a magazine, and inserting the magazine into the machine.

The process of loading tape holders into said carriers is performed beforehand and away from the magazine and the component mounting machine. Thus, the handling of the magazine is minimized to removing the magazine from the machine, placing the carriers in the magazine in and inserting the magazine into the machine. Accordingly, efficient handling of the tape holders and thereby, the carriers is facilitated. This, in turn, increases the time-efficiency of the loading of component holders in the machine considerably. Furthermore, the carriers are easy to handle and transport for the operator, which improves the efficiency of the production process.

According to a preferred embodiment of the present invention, a plurality of tape holders, carrying the various components associated with a specific job or mounting operation to be performed in the component mounting machine, are arranged at selected positions in the carrier according to a predetermined component position scheme. This predetermined component position scheme, i.e. in which position in the carrier a specific component tape holder, or actually a specific component, is to be placed, can be chosen in accordance with the specific job to be performed. This is done in order to optimize the mounting process, i.e. to minimize the distance a pick-up or mounting head has to travel in order to complete the mounting process for a circuit board. The term job refers to the identical or similar mounting of a specific set of different components on a series of circuit boards according to a predetermined pattern or scheme. Thereby, a job-specific mutual order of tape holder positions in the carrier is obtained.

Alternatively, a component specific order of tape holder positions may be obtained and there are also other possible orders of positions that may be obtained. An example thereof includes an order of component tape holder positions for optimizing the mounting operation of the component mounting machine. This provides for efficient job exchanges, thereby increasing the time efficiency of the machine.

It should be noted, that the present invention is also not restricted to the selected positioning of component tape holders in the carriers. On the contrary, the possibility of positioning the component tape holders in arbitrary positions in the carriers is indeed contemplated. As readily understood, this requires for the control system of the component mounting machine to be able to retrieve information regarding which component can be found in which position. This may for instance be performed by entering the position of each component tape holder, carrying a known component type and amount of that component, when placing the carrier together with the component tape holders in a magazine. However, according to the present invention, this is preferably and advantageously accomplished by using a tape guide, as earlier described, that is provided with identification means, e.g. in the form of markings, labels, such as bar code labels, identification circuits, or any other form of identification means.

Then, the identity of the tape guide is first associated with the corresponding component tape. This is preferably performed in connection with the loading of the component tape into the tape guide. Thereafter, when the carrier has been placed in the magazine, the identity of the tape guide is automatically transferred, via the magazine, to the control system of the component mounting machine when the tape guide is being loaded into the magazine. Thereby, the control system automatically recognizes which component type that is located in which position in the magazine. As long as the component tape and the tape guide are not separated, the identity of the tape guide is associated with the specific component type regardless of whether the unit of tape guide and component tape is attached to the magazine or not.

Furthermore, this has the additional benefit of eliminating or reducing the negative consequences of an operator failing to correctly position component tape holders at selected positions in a carrier. A more detailed description of the transfer of component tape information is disclosed in WO 00/38492, which hereby is incorporated by reference.

According to the present invention, one or several carriers, each carrying a plurality of component tape holders, may advantageously be stored in a storage facility or storage area. One or several of the stored carriers can then be provided from the storage area and placed in the magazine to be used in the mounting process. The magazine is thereafter inserted into the component mounting machine. Accordingly, a plurality of carriers can be prepared beforehand and stored ready for subsequent use in the manufacturing process. The carriers can be prepared to optimize the mounting process where the carriers are to be used.

Preferably, the component tapes of the carriers have already been loaded into a corresponding tape guide when stored with the carrier. Thus, the carrier contains the component tapes, the component tape holders and the tape guides to be used in a specific job. The loading of the component tape in the magazine is reduced to simply obtaining the carrier from the storage facility, placing the carrier in the magazine, and attaching each tape guide, either separately or together, into the appropriate position in the magazine. Thus, the time required for preparing a component mounting machine for a job, or for changing over from one job to another, is greatly reduced.

Also, carriers loaded with component tape holders that have already been used for a mounting process, may be removed from the magazine and stored when the job is finished. Thereby, carriers having a maintained job-specific order of component tape holders are obtained. In effect, it is possible to maintain the job-specific ordered carrier or carriers during periods other jobs are performed. When an interrupted job is to be resumed, or when a job having the same or similar component configuration as a job performed earlier is to be executed, the carrier or carriers, still loaded with component tape holders corresponding to the specific job, may be provided or retrieved from the storage area and re-used without further loading of the individual component tape holders. Thereby, the set-up time for a type of mounting job that has previously been performed is significantly reduced, which provides for an efficient upstart of a job. This is particularly beneficial when having recurring short job series, which are frequently interrupted by other mounting jobs.

According to the present invention, a number of carriers and a number of magazines may be used by a large, single component mounting machine and in a single mounting process or operation. Then, a number of carriers used in the same machine or for the same mounting process may preferably and advantageously be stored together. Preferably, they are then stored in the order of position in which they are to be used in the magazines of the machine, or the like.

As understood by the man skilled in the art, the method, system and arrangement in accordance with the present invention provides for a quicker and easier loading of component tapes in a component magazine. Thereby, the idle time of the magazine and, consequently, the component mounting machine may be significantly reduced. Furthermore, the handling of component tapes as regards storing and re-loading of component tapes is greatly facilitated.

Further details and aspects of the present invention will become apparent from the following description of preferred embodiments of the invention.

BRIEF DESCRIPTION OF THE DRAWINGS

Preferred embodiments of the invention will now be described in greater detail with reference to the accompanying drawings, in which.

DESCRIPTION OF PREFERRED EMBODIMENTS

With reference to FIGS. 1 to 8, a preferred embodiment of a method, a system and an arrangement for handling component tapes according to the invention is shown. The system comprises a magazine, a plurality of carriers, a plurality of tape guides, and a plurality of component reels, each holding a component tape carrying components positioned in sequence and covered by a protective cover tape. Furthermore, each tape guide can be loaded with a component tape held by a component reel, thereby forming a unit comprising a tape guide, a component reel and the component tape held by the reel and loaded into the tape guide. The magazine is adapted for receiving carriers, wherein each carrier is adapted for carrying a number of units of component reels and tape guides, each tape guide loaded with a component tape held by a component reel. According to a preferred embodiment of the inventive method, a number of units of component reels and tape guides, each loaded with a component tape, are arranged in a carrier. Then, the carrier is placed in a magazine for use in a mounting process of a component mounting machine, or is stored in a storage facility to be used when required in a mounting process. The carrier can be removed from the magazine, replaced by another and stored in the storage facility. The stored carrier can, thereafter, be provided from the storage area for placement in the magazine and for use in a further mounting process. Thereby, a specific set of units of tape guides, each loaded with a component tape, and component reels carried by a carrier can be maintained during interruptions of the mounting process, in which the specific set is used, without their mutual positions being disturbed or changed. Also, the specific set of units of tape guides, each loaded with a component tape, and component reels can be handled in an effective way.

Figure 1:
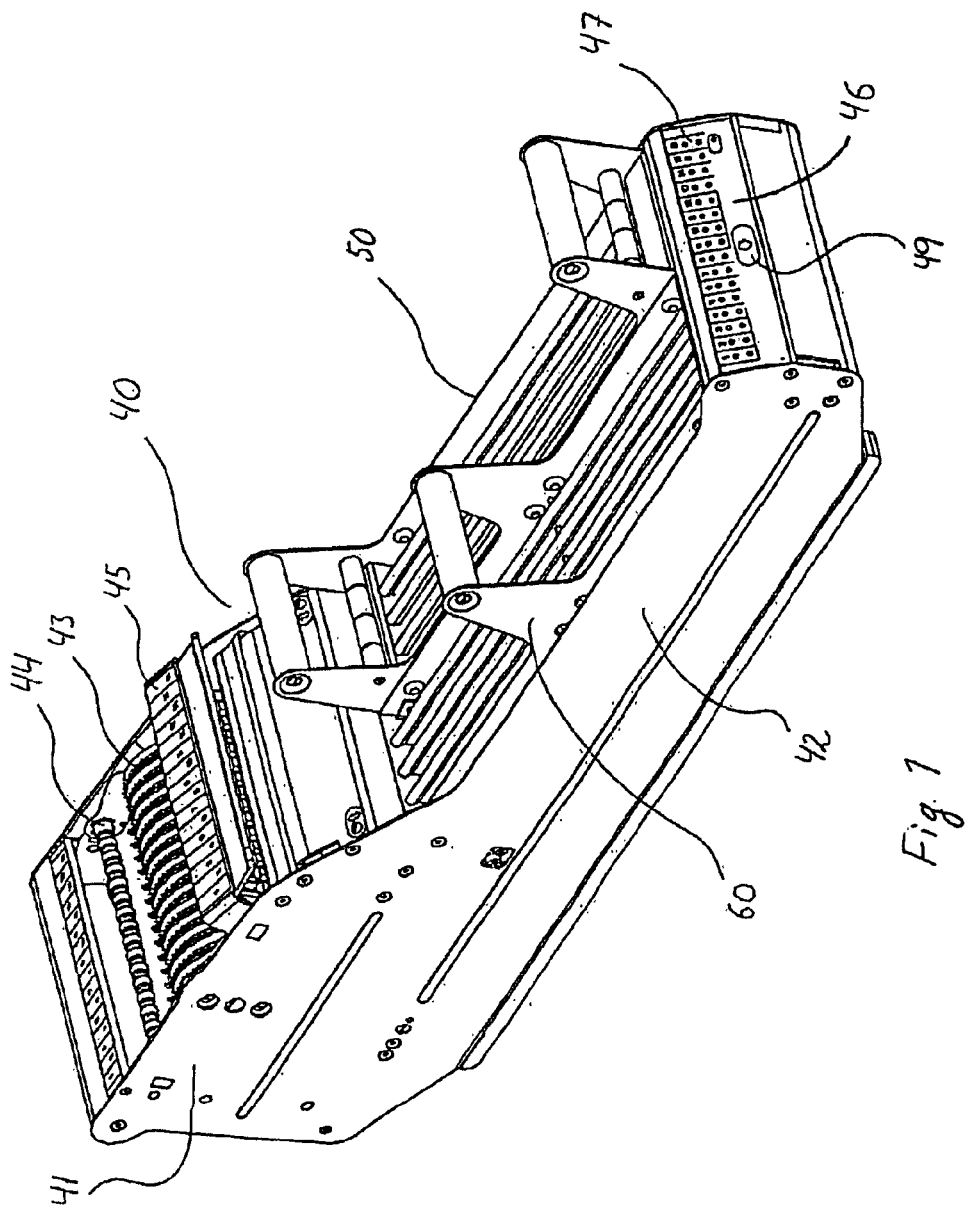
FIG. 1 is a perspective view of a magazine and two carriers placed therein according to a preferred embodiment of the invention.

Referring first to FIG. 1, there is shown a preferred embodiment of a component magazine 40 for a component mounting machine adapted for the reception of two carriers 50 and 60. The carriers 50 and 60 will be described in greater detail below with reference to FIGS. 2A and 2B. The magazine 40 comprises a forward portion 41 for receiving tape guides 10 and feeding the component tape to a picking position in the component mounting machine, and a rearward portion 42 for receiving the carriers 50, 60. The forward portion 41 comprises a feeding mechanism, including feeding wheels 43, forward locking element 44 adapted for receiving a plurality of tape guides, rearward locking elements (not shown), and a safety barrier 45. Each tape guide is placed and mounted in the magazine by interaction between a recess 22 of the tape guide and the forward locking element 44 of the magazine 40, and between a protrusion 20 of the tape guide and the rearward locking element of the magazine 40. When mounted in the magazine, the tape guides are in a position where the feeding wheels 43 of the magazine can engage holes provided in the component tape loaded into each tape guide and, thereby, feed the component tapes to a picking position in the machine. The safety barrier 45 ensures, in a lowered position as shown in FIG. 1, that all tape guides, mounted into the magazine, are correctly locked in an operational position. During insertion or removal of the tape guides the safety barrier 45 is raised.

An information panel 46 is included in the forward portion 41 and comprises light emitting diodes (LED's) 47 for indicating status information of, for example, tape guides loaded in the magazine 40 and interconnected with component tape reels carried by the carriers 50 and 60 placed in the magazine. Furthermore, the information panel 46 comprises communicating means 49, in this case in the form of a button 49, which enables the operator to communicate with the component mounting machine, for example when the magazine 40 is to be removed or extracted from the component mounting machine.

As can be seen in FIG. 1, the two carriers 50, 60 have alternative configurations in adaptation for carrying different sized component reels, the carrier 50 for carrying 13 inch reels and the carrier 60 for carrying 7 inch reels. Of course, the magazine 40 can receive two similar carriers. Furthermore, the magazine can be adapted for receiving and carrying other numbers of carriers, for example three or four carriers, or one large carrier, as well as carriers of different sizes or configurations. The carrier could, according to further embodiments, be adapted for simultaneously carrying reels of different diameters, and/or be adapted to be adjustable for receiving and carrying reels of different width. Such embodiments are described in greater detail below, with particular reference to FIGS. 14 and 15.

Figure 2B:
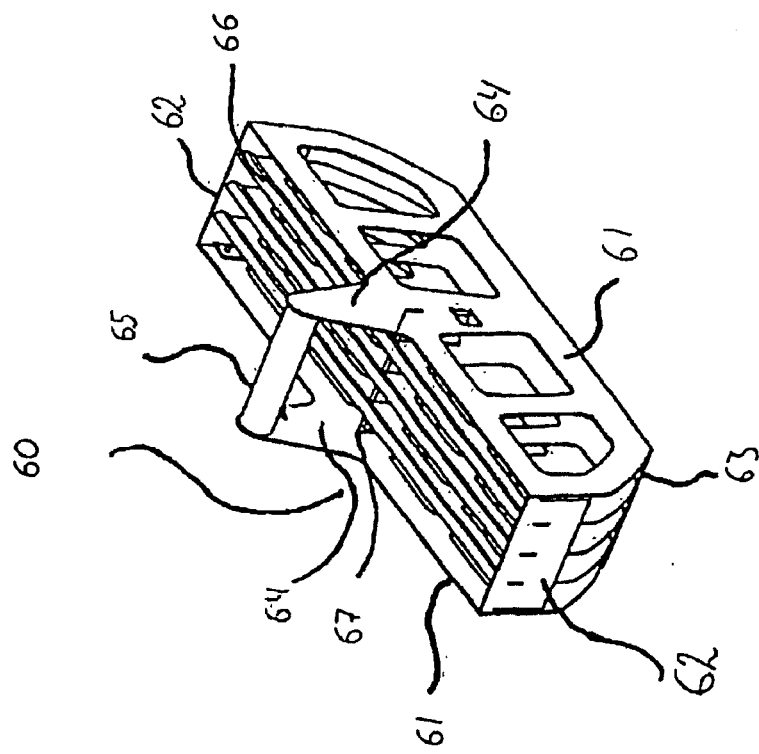
FIGS. 2A and 2B are perspective views of carriers according to preferred embodiments of the invention.
Figure 2A:
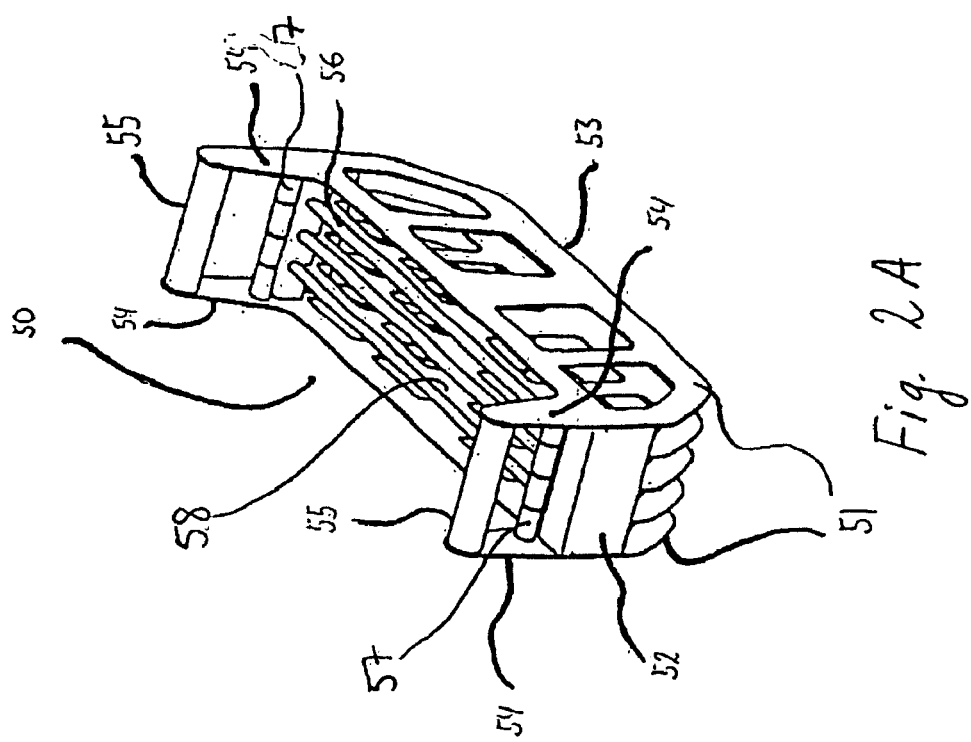

With reference now to FIGS. 2A and 2B, preferred embodiments of a carrier according to the present invention are illustrated. As can be seen in FIG. 2A, the carrier 50 is essentially shaped like a carrying basket and comprises a body having four essentially vertical walls, two longitudinal walls 51 interconnected via two lateral walls 52, and a horizontal, rectangular base 53. The walls 51, 52 and the base 53 are substantially planar. Furthermore, each longitudinal wall 51 is at each end thereof provided with upwardly projecting end portions 54. Furthermore, a handle 55, for facilitating the handling of the carrier, and a support bar 57, for supporting component reels carried by the carrier, are arranged and extend between each opposite pair of upwardly projecting end portions 54, i.e. between one longitudinal wall 51 to the other longitudinal wall 51.

The longitudinal walls 51, the lateral walls 52 and the base 53 are shown as separate parts, which are attached or mounted to each other. However it is of course conceivable to make the body as a one-piece structure. In this embodiment, the body is made of metal, such as stainless steel or aluminum.

The carrier shown in figure 2A has three intermediate walls 56 defining four separate compartments 58. The intermediate walls 56 are substantially planar and extend between the lateral walls 52. Thus, the intermediate walls 56 and the outer walls form four similar compartments 58 for receiving and carrying component tape reels (not shown in figure 2A), in this example 13 inch reels. FIG. 2B shows a carrier 60 for receiving 7 inch component tape reels. The carrier 60 comprises as described with reference to figure 2A, two longitudinal walls 61, two lateral walls 62, and a horizontal, rectangular base 63. A handle 65 is, furthermore, arranged between opposite upwardly projecting portions 64 of the respective longitudinal walls 61. Furthermore eight similar compartments 68 (cf. FIG. 3) are defined by three longitudinal intermediate walls 66 and a transversal intermediate wall 67, which is parallel to the lateral walls 62. Of course, the number of intermediate walls and their positions are selected in accordance with the desired number of compartments and their desired widths. For example, it is conceivable to design a carrier having compartments of different widths, thus being adapted to receive and carry component tape reels having different widths. Furthermore, it is possible to design a carrier adapted for carrying both 7 inch component tape reels as well as 13 inch component tape reels, or a carrier adapted for reels having other diameters, for example 3.5 inch reels. Moreover, the compartments are not necessarily defined by means of intermediate walls. There are a number of other conceivable arrangements that also separates the reels from each other and thereby enables them to rotate independently of each other, for example vertical protrusions arranged at the base of the carriers.

Since the carrier 60 when placed in the magazine will have one of the lateral walls 62 facing the forward portion 41 of the magazine (see FIG. 1), the carrier 60 will have a forward and a rearward set of compartments 68, as seen in the feeding direction of the component tape. Thereby, component reels arranged in the forward set of compartments would be in line with component reels arranged in the rearward set of compartments.

There will now be described, with reference to FIG. 3, the quick arranging of a component tape reel 70 and a tape guide 10, loaded with a component tape 72 held by the component tape reel 70, in a carrier 60. The pair of a tape guide 10 and a component tape reel 70, which may be handled as a single unit 74, is arranged, as indicated by the arrow 76, in a compartment 68 of the carrier 60. In this embodiment, a maximum of eight component reels can be arranged in the compartments of the carrier 60 and, accordingly, eight units 74 of tape guides and component tape reels 70 can be arranged in the carrier 60. After arranging a plurality of tape guides 10 and the corresponding component tape reels 70 in the carrier 60, the tape guides 10, the component reels 70 and the carrier 60 may, in turn, be handled as one single unit.

Figure 4:
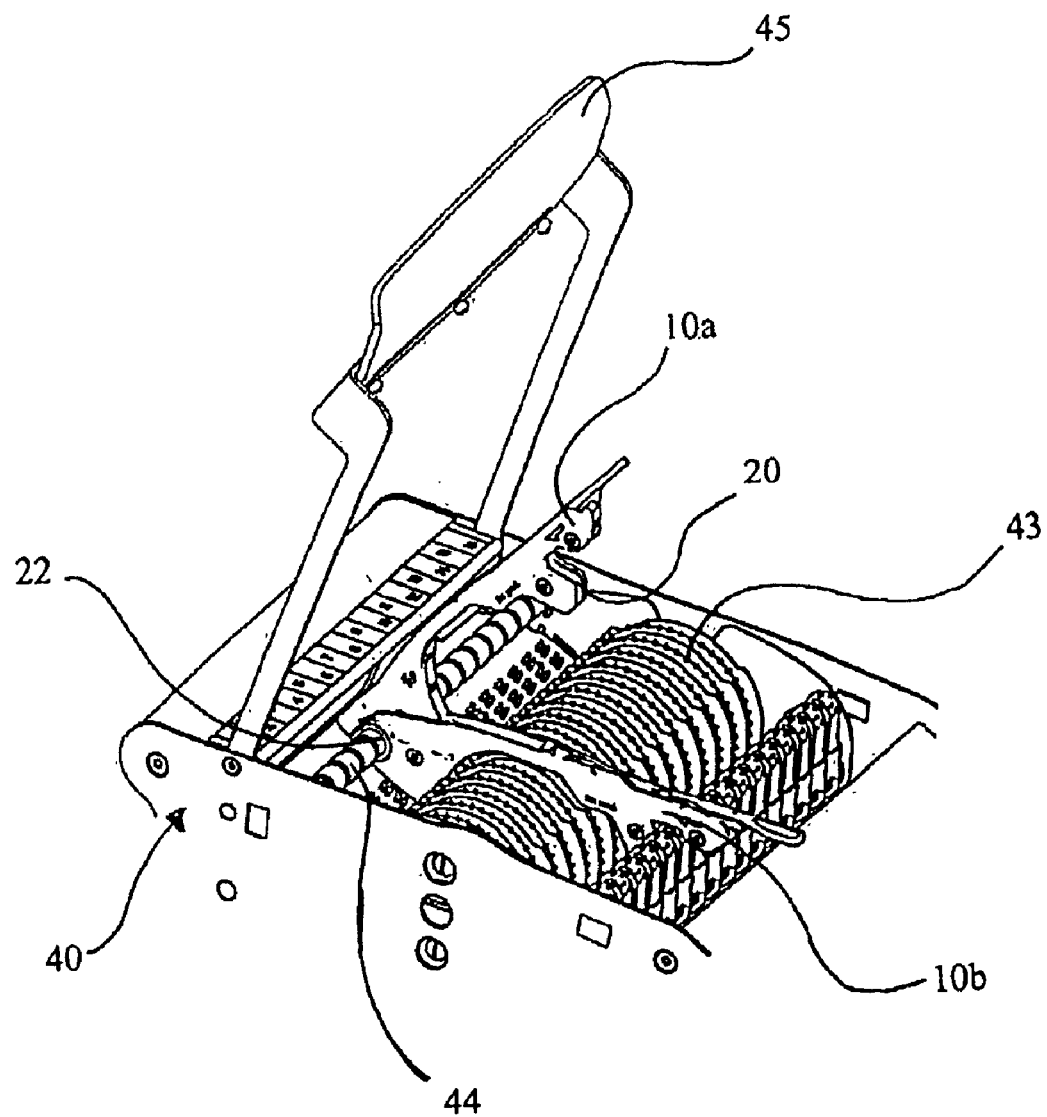
FIG. 4 is a scrap view illustrating the loading of tape guides in a magazine.

Referring now to FIG. 4, there is shown a partial view of a portion of the magazine 40 of FIG. 1 in order to illustrate the loading of tape guides 10 in the magazine 40. Two tape guides 10 are shown, one already having been mounted in the magazine 40 and one in the process of being mounted. The mounting is performed by first having the forward locking element 44 engaging with a forward locking element 22 of the tape guide, which in this embodiment are an axle 44 and a corresponding essentially semi-circular recess 22. This is illustrated by the tape guide 10a. Then, the tape guide is simply pivoted downwards, such that the rearward locking elements, in the preferred embodiment being spring-back locking elements, engage with corresponding locking elements 20 of the tape guides 10 (see FIG. 5). Following engagement between the rearward locking element of the magazine 40 and the corresponding locking element 20 of the tape guide 10, the mounting operation is completed. The completed mounting is illustrated by tape guide 10b. For removal of the tape guides 10, the rearward locking elements are easily released by simply lifting the handle 19 of the tape guide 10.

In the mounted position, the feeding holes of a component tape loaded in the tape guide (see FIG. 3) engage with the feeding pins of a feeding wheel 43 in the magazine 40. Furthermore, the tape guide is provided with an electronic circuit that automatically is connected to electronic connections in the magazine 40, such that information regarding the tape guide and the component tape is automatically accessible by the control system of the component mounting machine.

Figure 5:
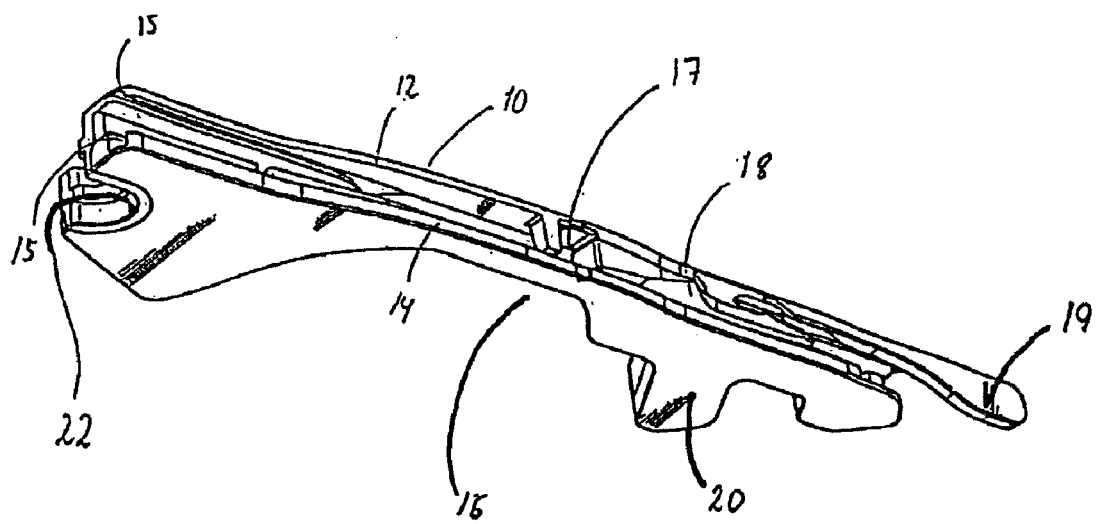
FIG. 5 is a perspective view of the tape guide according to a preferred embodiment of the invention.

With reference to FIG. 5, there is illustrated a preferred embodiment of a tape guide according to the present invention. A tape guide 10 comprises an elongated open ended profile with opposite elongated walls 12, 14 provided with longitudinal grooves 15 extending along the entire elongated walls, for facilitating insertion of a component tape and for guiding the component tape. As can be seen in the FIG. the elongated wall of the tape guide 10 at the grooves 15 is made very thin. Therefore, the width of the tape guide 10 only just exceeds the width of the component tape. Consequently, a tape guide 10 arranged for use with 8 mm tapes has a width of less than 10 mm.

Furthermore, the tape guide 10 is provided with an opening 16 for enabling the pins of a feeding device 43 (see FIG. 1), provided in a magazine attached to a component mounting machine, to engage holes of a component tape. Furthermore, the tape guide 10 is provided with an essentially plow shaped separating element 18 for separating and lifting a lateral portion of a cover tape from the component tape, thereby exposing the component and enabling the picking thereof at a picking slot 17.

The tape guide 10 can be detachably mounted to a component magazine 40, and can, accordingly, be removed together with the component tape when unloading the component tape from the magazine. The tape guide 10 is further provided with a handle 19 for facilitating the attachment and detachment of the tape guide 10 into and from the magazine. Also, the tape guide is provided with locking elements in the form of a protrusion 20 and a recess 22 provided at opposite ends of the elongated tape guide 10, for attachment of the tape guide to a magazine as described above with reference to FIG. 4.

Figure 3:
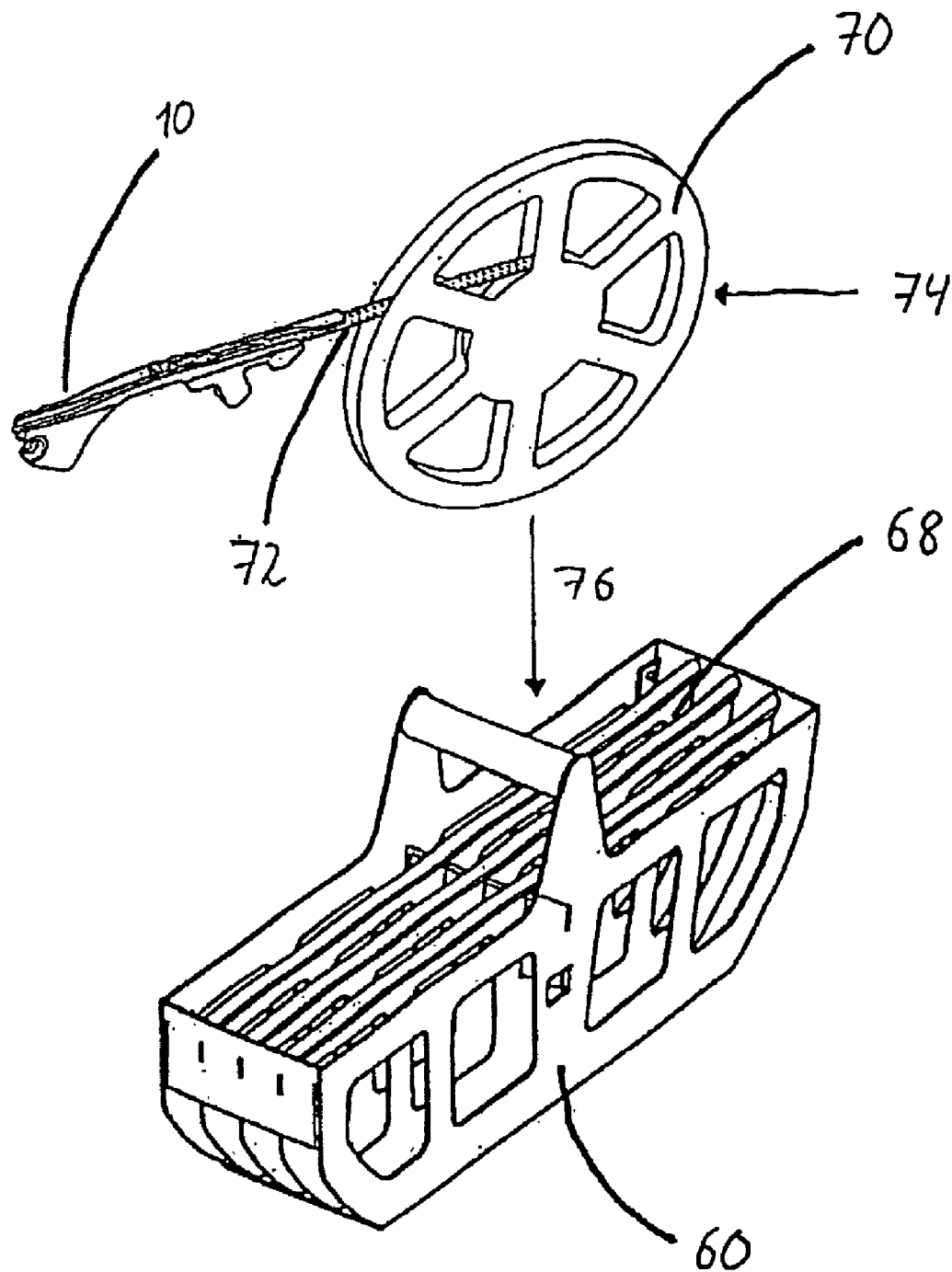
FIG. 3 is a perspective view of a carrier according to FIG. 2B and a tape guide loaded with a component tape held by a component tape reel.
Figure 6:
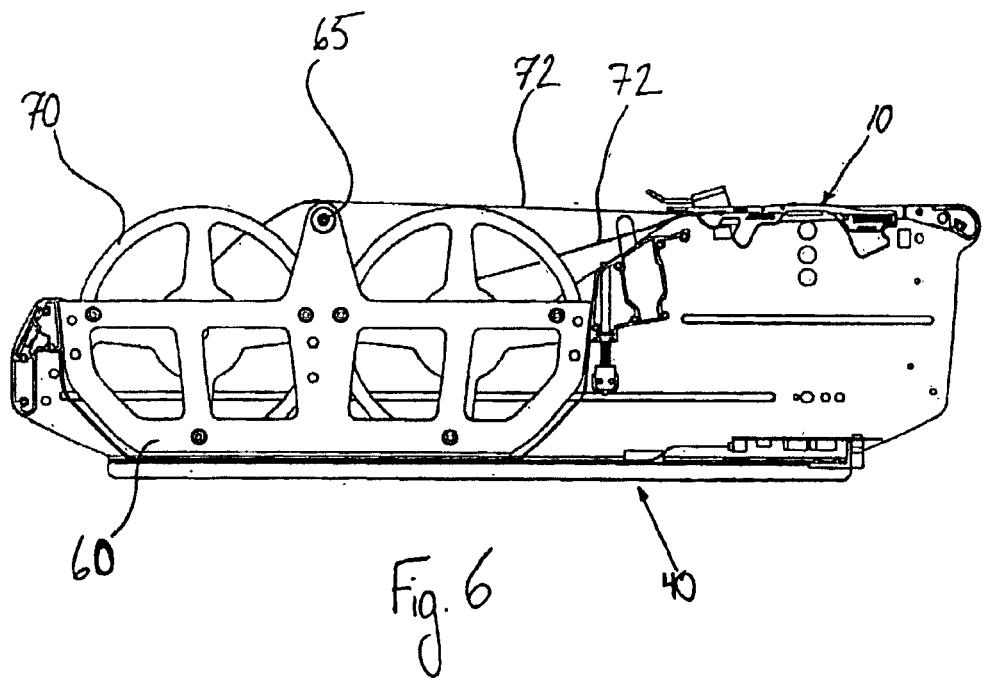
FIGS. 6 and 7 are schematic illustrations of a magazine provided with a carrier carrying component tape reels and tape guides, each tape guide being loaded with a component tape as shown in FIG. 3, according to alternative embodiments of the invention.
Figure 7:
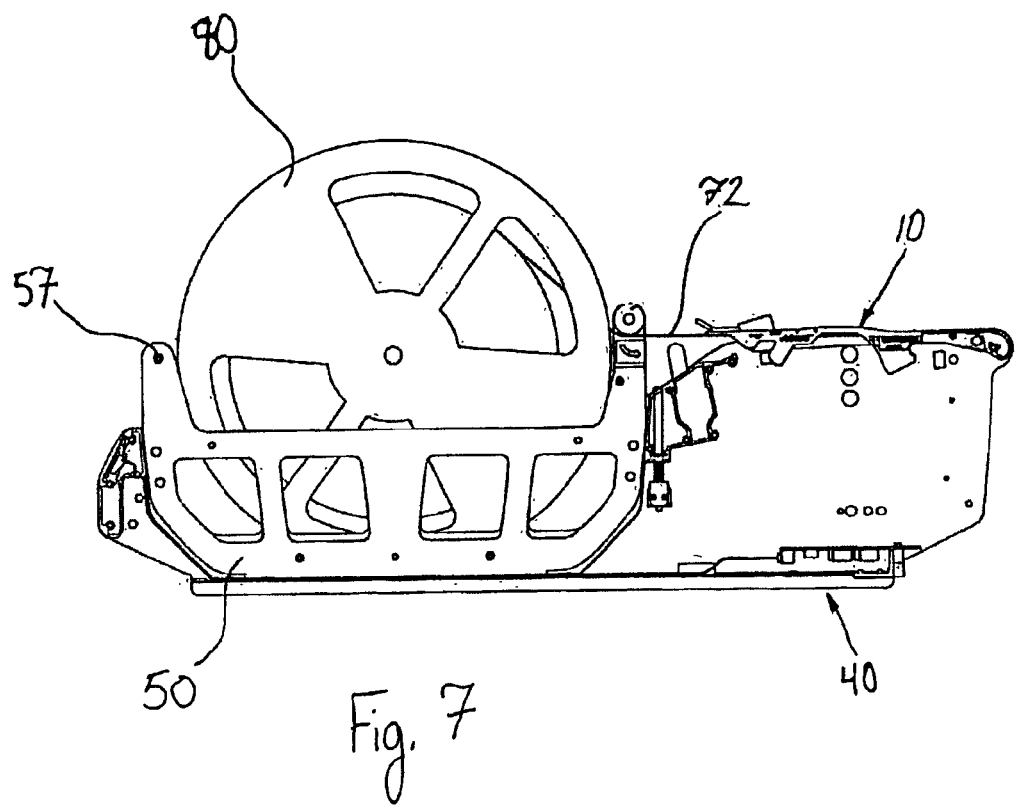

Referring now to FIGS. 6 and 7, there are shown cross sectional illustrations of a magazine 40 provided with a carrier 50 or 60 carrying component tape reels 70 and 80, respectively, and tape guides 10, each loaded with a component tape 72, as shown in FIG. 3. The figures are intended to show the interaction between the magazine 40, the carriers 50, 60, the tape guides 10, and the component reels 70, 80 holding the component tapes 72. FIG. 6 shows the carrier of FIG. 2b, and FIG. 7 shows the carrier of FIG. 2a.

Referring to FIG. 6, a carrier 60 adapted for carrying 7 inch component tape reels 70 is removably placed in a magazine 40 of a component mounting machine. Each component tape reel 70 holds a component tape 72 loaded into a tape guide 10. The tape guides 10 are detachably mounted in the magazine 40. A tape guide 10 is loaded or mounted into the magazine 40, in the manner described above. As can be seen, the component tapes 72 of the component tape reels 70 arranged in the rearward set of compartments, as seen in the feeding direction of the component tape, run above or slide against the handle 65 of the carrier 60. Thereby, the feeding of component tapes 72 of the reels 70 arranged in the rearward set of compartments will not interfere with the feeding of the component tapes 72 of the component reels 70 arranged in the forward set of compartments, and vice versa.

FIG. 7 shows a carrier 50, adapted for carrying 13 inch component tape reels 80, removably placed in a magazine 40. Each component tape reel 80 holds a component tape 72 loaded into a tape guide 10. The tape guides 10 are, as described above, detachably mounted in the magazine 40. Furthermore, as can be seen, the component reels 80 rests against the support bar 57 of the carrier 50, which support bar 57 carries a number of individual support rolls, preferably one for each carrier reel, that supports the reels and reduces the friction between a reel and the support bar when the reel is rotated during feeding of the component tape thereof.

Figure 8:
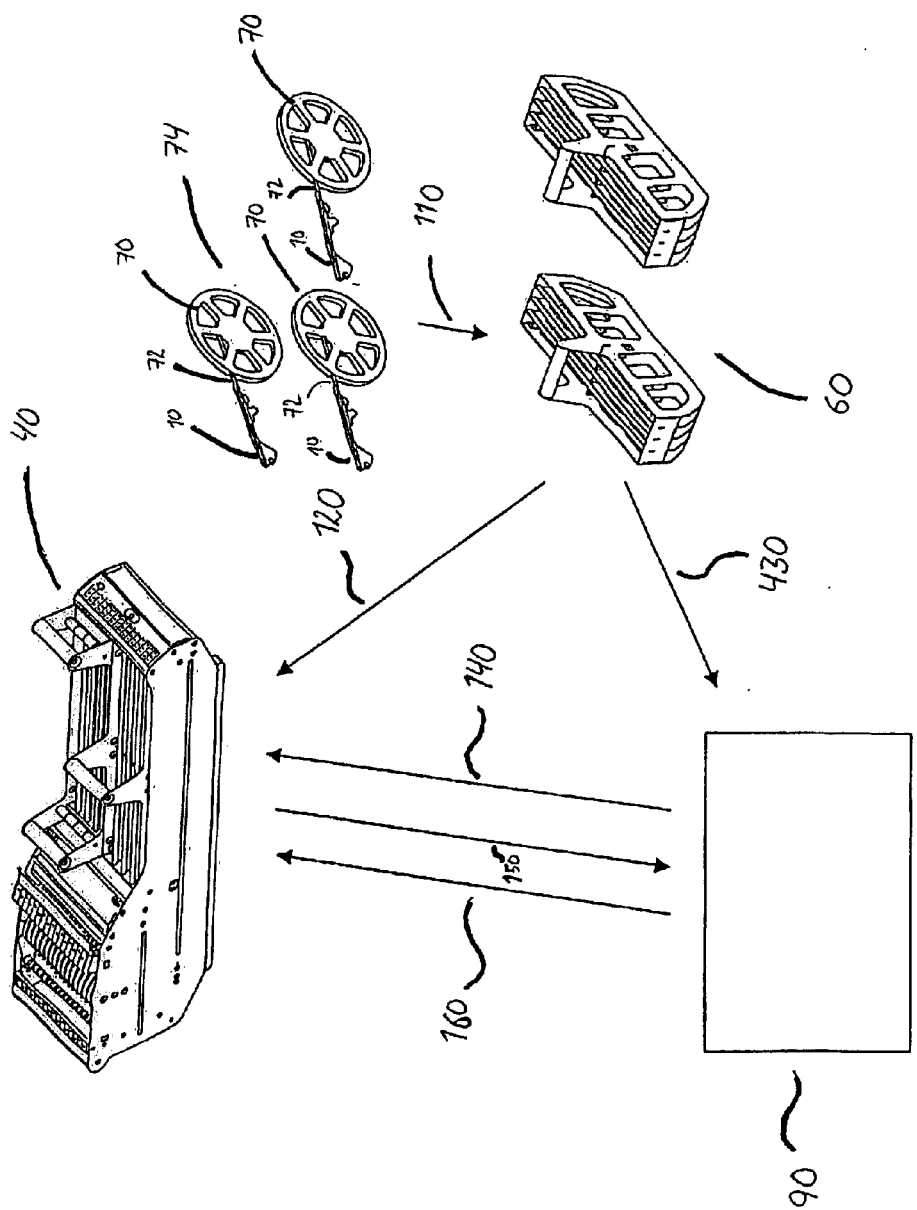
FIG. 8 is a block diagram illustrating the principles of the method for handling component tapes according to preferred embodiments of the present invention.

There will now be described, with reference to the block diagram of FIG. 8, the method for handling component tapes according to preferred embodiments of the present invention. There is shown a plurality of units 74, each comprising a tape guide 10 loaded with a component tape 72 held by a component tape reel 70.

Furthermore, there is shown a plurality of carriers 60, a storage facility 90 and a magazine 40. The arrows 110–160 indicate steps to be performed in the method. According to the invention, the units 74 are arranged at 110 in a carrier 60. The carrier 60 can, subsequently, be placed at step 120 in the magazine 40. The magazine 40 can, then, be inserted in a component mounting machine (not shown) where the components can be used in a mounting process. Alternatively, after the arranging of the units 74 of component tape reels 70 and tape guides 10 in the carrier 60, the carrier 60 is stored at 130 in the storage facility 90. Then, when the particular carrier or the components therein are required, the carrier 60 carrying the units 74 of component tape reels 70 and tape guides 10 is provided from the storage facility 90 and placed at 140 in the magazine 40.

According to another preferred embodiment of the invention, the units 74 of component tape reels 70 and tape guides 10 are arranged at 110 in a carrier 60, and the carrier 60 is subsequently placed at 120 in the magazine 40. The magazine 40 is then inserted in a component mounting machine where the components thereof can be used in a mounting process. Thereafter, when the mounting process has been completed, the magazine 40 is removed from the machine, and the carrier(s) 60 is (are) removed from the magazine 40 and stored at 150 in the storage facility 90. Thereby, the component tape reels 70 and tape guides 10 and, in turn, the component tapes 72, are stored in an effective way, i.e. the components reels 70 holding the specific components carried by the specific carrier 60 are stored as a component selection unit. By providing the carrier from the storage facility 90 and once again placing, at 160, the carrier 60 in the magazine, this component selection unit can be used in a further mounting process. Subsequently, the magazine 40 is inserted in the component mounting machine, and the specific type of components carried by the carrier 60 can again be used in the mounting process.

This procedure is particularly useful when specific sets of components, held by component reels carried by a carrier, are used during intervals interrupted by mounting processes using other sets of components, held by other component reels carried by another carrier. The carrier carrying the specific set of components is stored in the storage facility during the periods when other sets of components are used and is, then, easily provided from the storage facility and placed in the machine when required. Although one type of component reels, tape guides and carriers has been used to exemplify the above described embodiments, other types of component reels and carriers can be used in the present invention, as the skilled man realizes.

There will now be described, with reference to FIGS. 9–12, alternative embodiments of the carrier according to the present invention. In these figures, the intended feeding direction for the component tapes (not shown) is indicated by an arrow.

Figure 9:
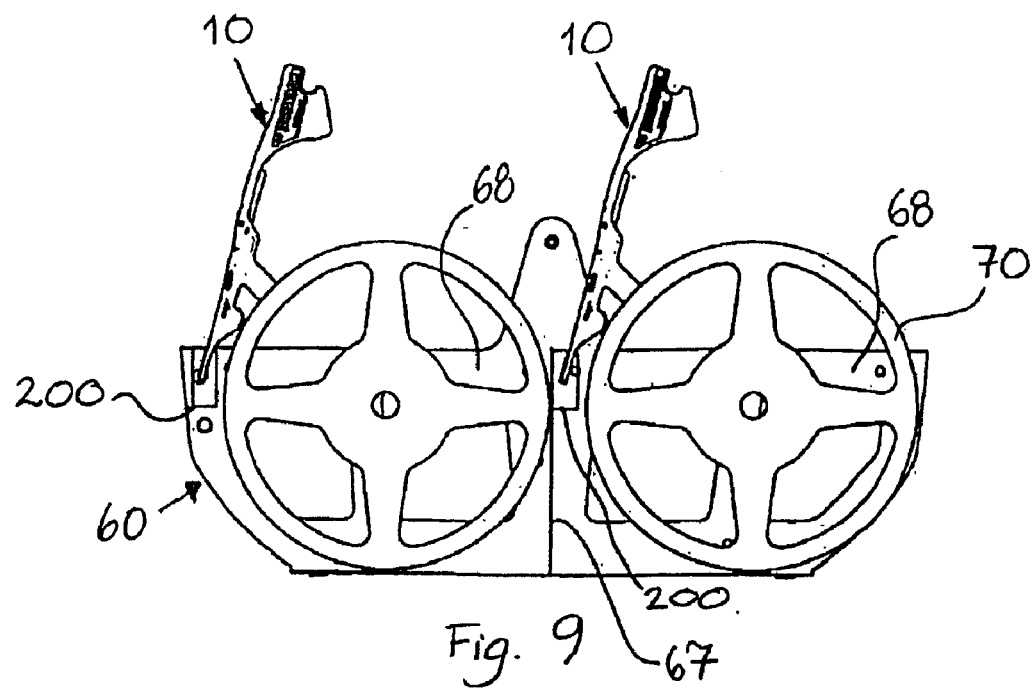
FIGS. 9–12 are illustrations of carriers having holders for tape guides according to alternative embodiments of the invention.

Referring first to FIG. 9, there is shown a schematic cross sectional illustration of an alternative embodiment of the invention. A carrier 60 includes holders 200 for tape guides 10 arranged in each component reel compartment 68 as illustrated. Each compartment 68 is provided with a tape guide holder 200 that is located on the inside of the lateral wall of each compartment 68, behind the compartment tape reel as seen In the feeding direction of the component tape. Each holder 200 is arranged to receive and support the handle of a tape guide 10. This allows for a deposition of tape guides 10, each loaded with a component tape held by a component tape reel 70 arranged in a compartment 68 of the carrier 60, in the carrier 60 when the carrier is not used. In a further embodiment (not shown) each reel compartment 68 has two holders, one according to the above described embodiment and one at the opposite side of the compartment, thus making the carrier essentially symmetrical.

Figure 10:
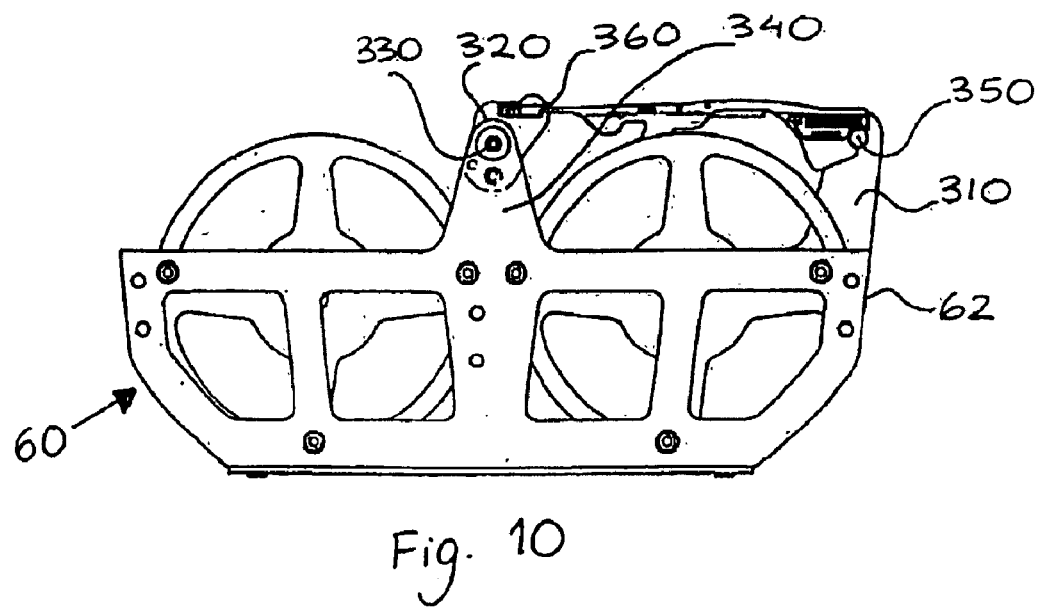

Referring now to FIG. 10, there is shown a schematic illustration of a carrier 60 having holders for tape guides 10 according to a further alternative embodiment of the invention. Each tape guide holder comprises a forward holding element 310, arranged at the forward lateral wall 62 of the carrier 60, and a rearward holding element 320, attached to a horizontal bar 330 mounted between two opposite support plates 340. The support plates 340 are vertically arranged at the upwardly projecting central portion of the longitudinal walls 61 of the carrier 60, respectively, and the bar 340 also functions as the handle of the carrier 60. In another example, the bar 340 is parallel with the handle of the carrier 60 and is arranged above the handle 64. Optionally, the support plates 340 and the bar 330 are detachably arranged at the carrier 60 to facilitate the procedure of placing the component tape reels 70 in the compartments and loading each tape guide 10 with a component tape. The forward holding element 310 comprises a cylinder-shaped support element 350, suitably having a general configuration similar to that of the forward locking element 44 of the magazine 40, for engagement with the recess 22 of a tape guide 10. Furthermore, the rearward holding element 320 comprises a support part 360 for supporting the handle 19 of the tape guide 10.

As can be seen in the figure, the tape guides 10 are positioned above the forward compartments of the carrier, as seen in the feeding direction. This is possible due to the slim configuration of the tape guide. Thus, even though the carrier accommodates only four parallel compartments, the total width of eight tape guides placed side by side does not exceed the width of the carrier.

Figure 11:
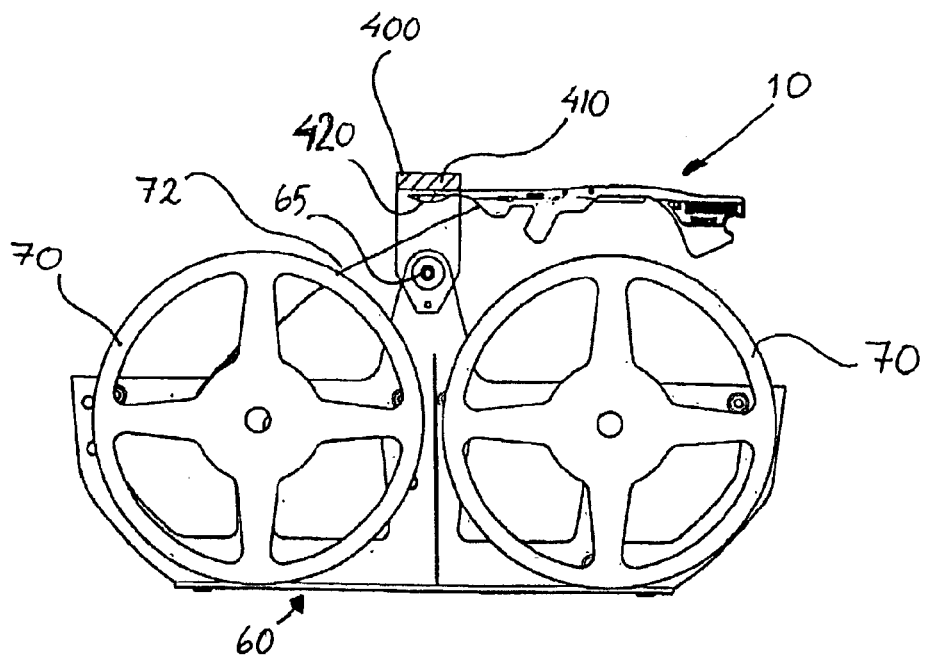

With reference to FIG. 11, there is shown a schematic cross sectional illustration of a carrier 60 having a holder 400 for a plurality of tape guides 10 according to yet another alternative embodiment of the invention. The holder 400 of the carrier 60 is arranged along the horizontal bar or handle 65 of the carrier 60. The holder 400 comprises an upper support plate 410 and a lower support plate 420. The opposing support plates 410, 420 defines an intermediate space extending along the length of the support plates. The intermediate space is preferably divided, by providing vertical walls (not shown) extending between the support plates, into a number of separate slots. Each slot is adapted for the reception and support of the handle 19 of a tape guide 10 (cf. FIG. 5), and has a width that is adapted to the width of the tape guide handle. As is described above with reference to FIG. 10, due to the slim configuration of the tape guide, there is sufficient room for positioning all tape guides, loaded with component tapes for the entire carrier, side by side along the support plates 410, 420. This entails that all of the tape guides can be directed in the same direction during deposition in the holder 400. As an alternative to the configuration with separate slots, as described above, it is also conceivable to have one single slot extending along the entire length of the support plates, i.e. without the vertical separating walls described above.

As can be seen in the figure, the component tapes 72 of the component reels 70 arranged in the rearward set of compartments run above the handle 65 of the carrier 60 to avoid interference between component tapes of component reels arranged in the rearward set of compartments and component tapes 72 of component reels 70 arranged in the forward set of compartments.

Figure 12:
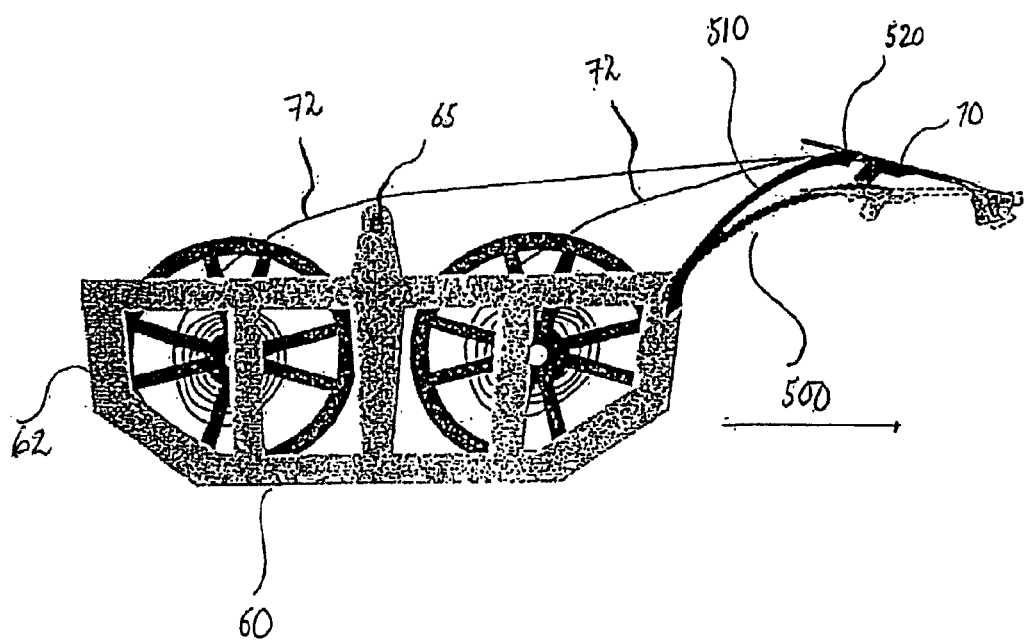

Referring now to FIG. 12, there is shown in schematic form a carrier 60 provided with a number of holders 500 for tape guides 10 according to an alternative embodiment of the invention. Each holder 500 comprises a holder arm 510 and a locking element 520 for ready and quick attachment and detachment of a tape guide 10. In the embodiment shown, each holder arm 510 is rigidly mounted at the upper part or edge of the forward lateral wall 62 of the carrier 60, but has a flexibility sufficient to permit loading of the tape guide 10 in the magazine 40, while still being attached to the arm 510. In a further embodiment, each holder arm, either rigid or flexible, is pivotably attached to the carrier. Alternatively, the tape guide may be pivotably attached to the carrier, such that the loading of the tape guide to the magazine is reduced to simply placing the carrier in the magazine and pivoting the tape guide in position.

According to the illustrated example, all holders 500 are mounted along the upper part or edge of the lateral wall 62 to enable attachment of the tape guides 10 required for all the tape reels 70 of both the forward and the reel hard compartments 68. As in the embodiment described with reference to FIG. 11, the component tape 72 of the component reels 70 arranged in the rearward set of compartments runs above the handle 65 of the carrier 60.

According to the embodiments shown in FIGS. 9, 10, 11 and 12, the tape guides, each loaded with a component tape, can be easily placed in the carrier together with the component tape reels. This ensures effective storage of the component reels and the tape guides since each tape guide interconnected with a component reel via a component tape can be arranged as a single unit in the carrier. Furthermore, it provides for a quick upstart of a component mounting machine since the already loaded tape guides is stored together with the corresponding component reels in the carrier. In other words, the carrier carrying the component tape reels is placed in the magazine, the tape guides are mounted into the magazine and the magazine is inserted in the machine. Furthermore, the tape guide compartments and the tape guide holders shown ensure that the tape reels cannot be accidentally unrolled during transportation or storage of the carriers. Additionally, the orientation of the tape guides is preserved during storage of the carriers, which entails a facilitated and quicker mounting of the tape guides into the magazine, which also contributes to a quick upstart of the machine.

Although the carriers with holders described wit reference to FIGS. 9 and 12 are illustrated with forward and rearward compartments for arraying 7 inch reels, these holder embodiments are also particularly suitable for carrier adapted for carrying 13 inch component reels. Furthermore, the holder embodiment shown in FIGS. 9–12 may also be used with carriers adapted for component reels of other diameters, for example 3.5 inch component reels. Furthermore, the embodiments shown are not restricted to carriers having eight compartments, on the contrary they can a so be used in carriers having any selected number of compartments in accordance with the widths of the reels, as well as the width of the carrier.

Figure 13:
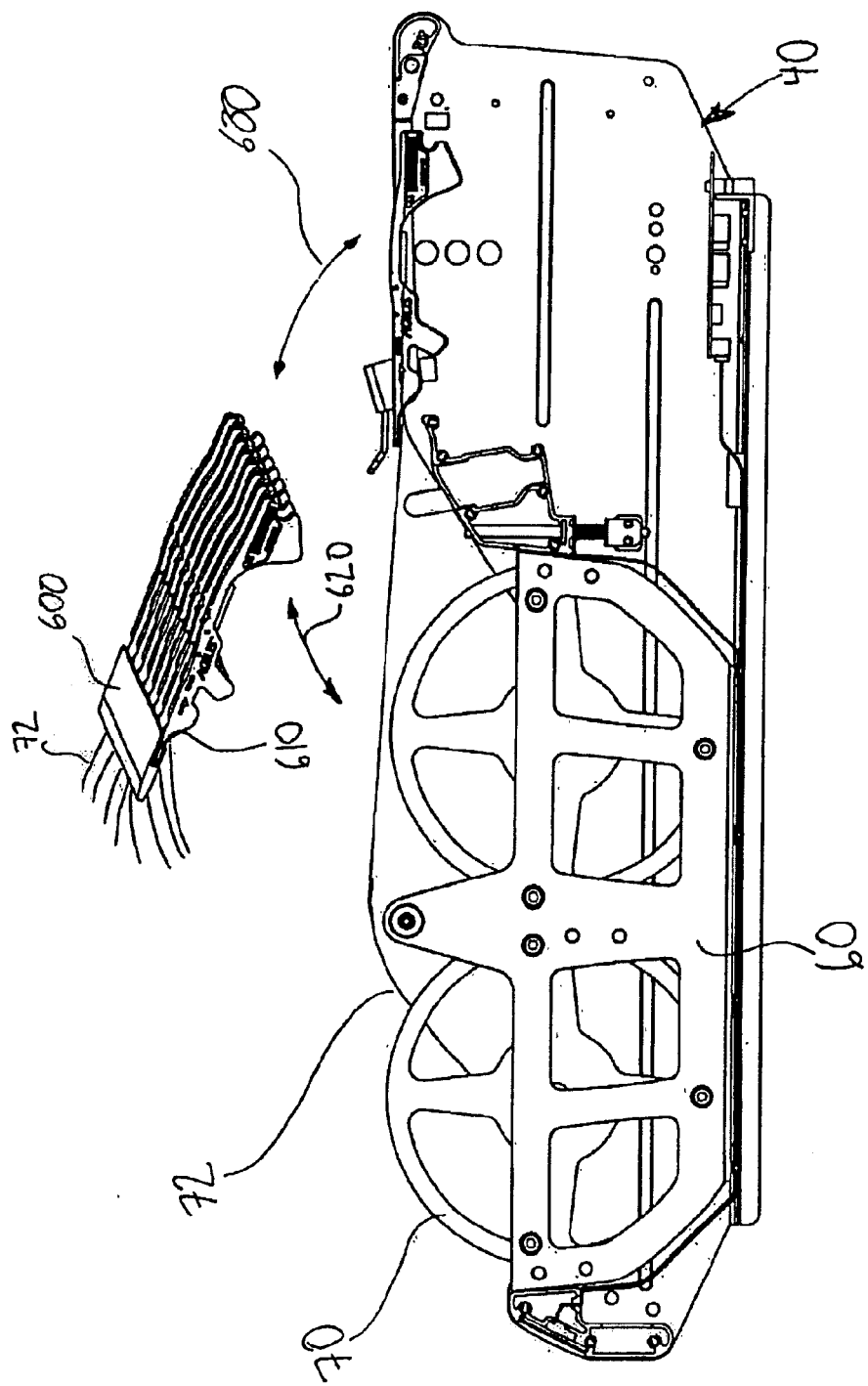
FIG. 13 is an illustration of a grouping handle for simultaneous manipulation of a plurality of tape guides.

Referring to FIG. 13, illustrating in schematic form a further embodiment of the invention, a grouping handle 600 for simultaneously moving and removing a plurality of tape guides 10 is shown. The grouping handle 600 comprises eight holders 610, each adapted for receiving and holding the handle 19 of a tape guide 10. As understood by the skilled man, the holders 610 can be designed as one holder, or slot, holding all tape guides. After the placement of a carrier 60 carrying component reels 70 in a magazine 40 the grouping handle 600 is, for example, used for a quick and simultaneously mounting, as indicated by the arrow 620, of all tape guides 10, each loaded with a component tape 72 which, in turn, is held by a component reel 70 carried by the carrier 60. The arrow 630 indicates the quick mounting of the tape guides 10 in the magazine 40 by means of the grouping handle 600. Of course, the grouping handle 600 can be used for quick releasing of the tape guides as well. The grouping handle 600 is easily handled with one hand by the operator, which as described provides for an effective and simultaneous handling of a number of tape guides. Furthermore, the tape guides 10 keep their mutual positions during transfer of the tape guides.

Figure 14:
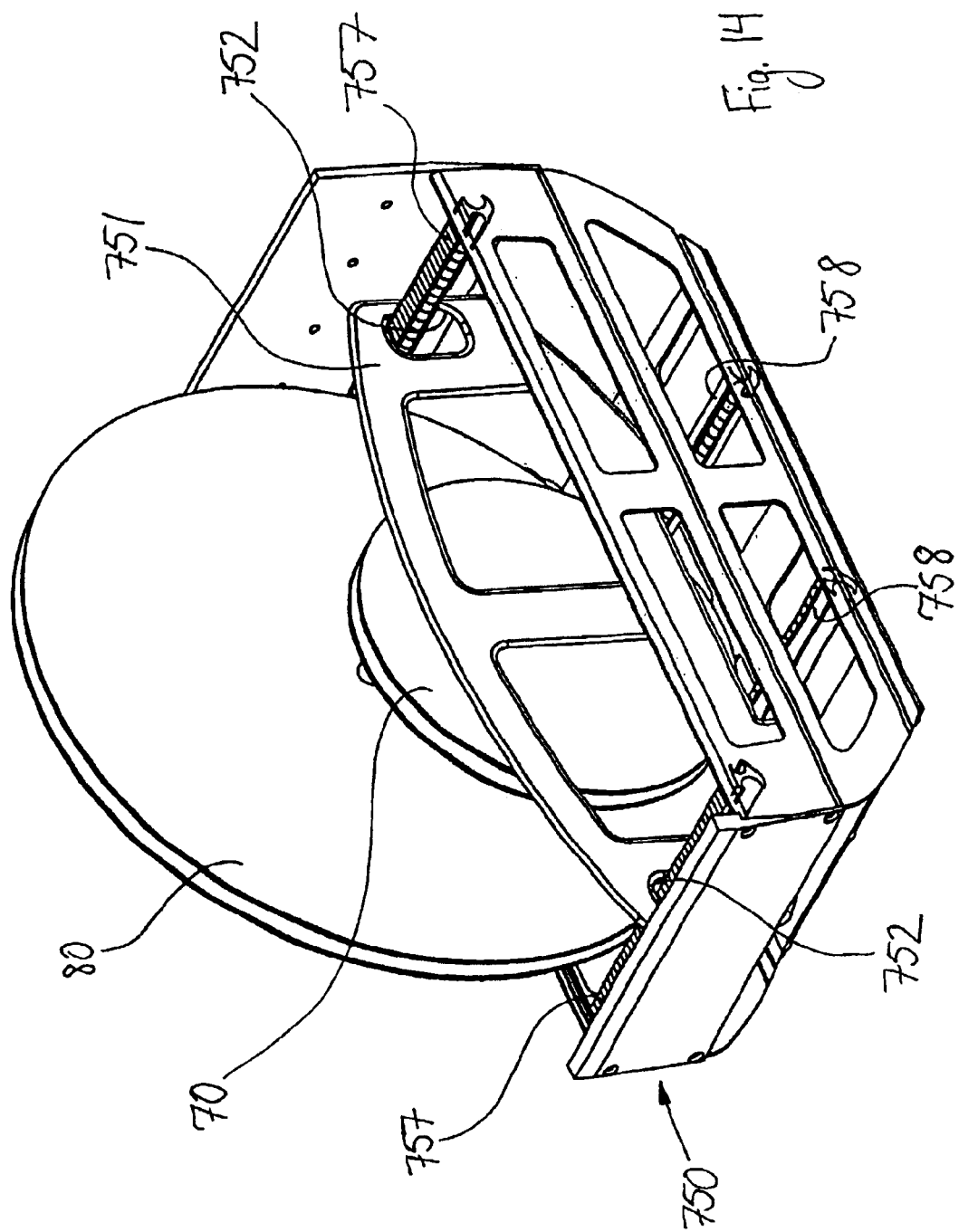
FIGS. 14 and 15 are illustrations of carriers for carrying reels of different diameters and/or widths according to alternative embodiments of the invention.
Figure 15:
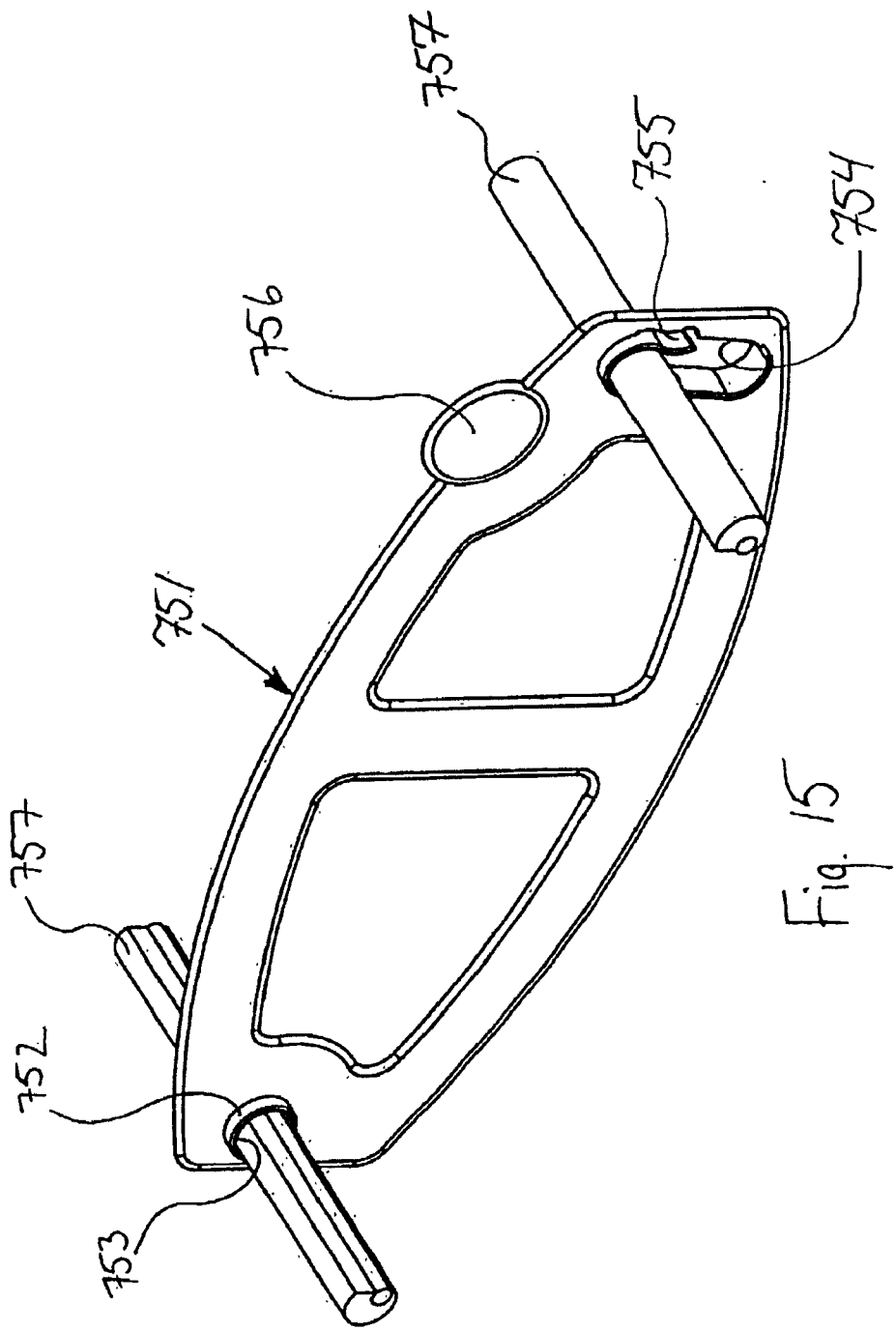

Turning now to FIGS. 14 and 15, there is shown an embodiment of a carrier in which the carrier 750 is arranged for receiving and carrying reels of different diameters, as well as being arranged for receiving reels of different widths. In addition to support bars 757, corresponding to the support bars 57 of the carrier 50 described above with reference to FIG. 2A, the carrier 750 of the present embodiment is provided with additional support bars 758 arranged at the bottom of the carrier. The lower support bars 758 enables the carrier to carry small reels 70, without the risk of the small reels 70 moving about in the carrier during use. In the present embodiment, the lower support bars or rollers 758 are arranged to also support the large component tape reels 80.

Furthermore, the carrier 750 comprises intermediate walls 751, only one of which being shown, for separating adjacent compartments for receiving component tape reels 70, 80. According to this embodiment, the walls 751 are laterally movable in order to adapt the width of the compartments to the width and/or the number of reels each compartment is adapted to accommodate. Each wall 751 is provided with a through hole 752 arranged at each end of the wall 751, such that the support bars 757 may be inserted into the holes and the entire wall may be moved along the parallel support bars 757.

With particular reference to FIG. 15, there is shown one solution of interaction between the movable walls 751 and the support bars 757. However, as readily understood by the man skilled in the art, there are a number of alternative solutions that may be contemplated without departing from the scope of the present invention. In this embodiment, the wall 751 comprises at one end thereof a sleeve 752 extending co-axially with one of the support bars 757. The interior 753 of the sleeve 752 is arranged for sliding along the first support bar 757. At the other end of the wall 751, a through hole 754 is provided for enabling sliding movement along the other support bar 757. Furthermore, the through hole 754 has an increased extension perpendicular to the support bar, i.e. in the vertical direction, thus enabling the entire wall 751 to be pivoted about a pivot point along the longitudinal axis of the sleeve 752.

Furthermore, there is provided a snap-in locking element 755 for holding the wall 751 in a locked position when the carrier is in use, and in a released position when the width of the compartments are to be adjusted. A handle or grip 756 is provided for enabling an easy pivoting of the wall 751. Thus, by lifting the end of the wall 751 where the snap-in locking element 755 is located, preferably using the grip 756, the wall 751 is released from a locked state into a released state in which the wall may be moved along the direction of the parallel support bars 757.

For ease of description, only one reel of each diameter has been illustrated in FIG. 14, as well as only one intermediate wall. However, as understood by the skilled person, the number of carried reels and intermediate walls can be adapted to any suitable number without departing from the scope of the present invention.

Although specific embodiments have been shown and described herein for purposes of illustration and exemplification, it is understood by those of ordinary skill in the art that the specific embodiments shown and described may be substituted for a wide variety of alternative and/or equivalent implementations without departing from the scope of the present invention. Consequently, the present invention is defined by the wordings of the appended claims and equivalents thereof.

What is claimed is:

1. A method of handling component tapes at a component mounting machine, each component tape being held by a component tape holder and carrying components positioned in sequence, the component mounting machine having a magazine from which said components are supplied to be used in a mounting process of said component mounting machine, said method comprising the steps of providing at least one portable carrier for carrying component tape holders;

arranging a plurality of component tape holders, each holding a component tape, in said at least one carrier; and thereafter placing said at least one carrier in said magazine, whereby said magazine is loaded with components for said mounting process.

2. The method according to claim 1, further comprising the step of storing, in a storage area, said at least one carrier, having said plurality of component tape holders arranged therein, wherein said step of placing comprises providing said at least one carrier from said storage area.

3. The method according to claim 1, further comprising the sequential steps of removing said at least one carrier from said magazine;

storing said removed carrier(s) in a storage area;

providing said stored carrier(s) from said storage area; and placing said stored carrier(s) in a magazine.

4. The method according to claim 1, wherein said step of arranging comprises arranging said plurality of component tape holders at selected positions in said at least one carrier according to a predetermined component position scheme.

5. The method according to claim 1, wherein said magazine is arranged for replaceably receiving a plurality of tape guides, each tape guide being arranged for detachable mounting in said magazine and, when mounted, for bringing a corresponding component tape in position for tape feeding and component picking in the component mounting machine, further comprising the steps of loading each component tape held by said plurality of component tape holders into a corresponding tape guide, whereby said component tape holder and the corresponding tape guide are interconnected via said component tape; and arranging said tape guide at said carrier, said tape guide then being carried by said carrier, wherein, following said steps of loading each component tape and arranging said tape guide, each tape guide is held either by the corresponding component tape holder, by the carrier itself, or by both; and wherein said step of placing comprises mounting each tape guide carried by said at least one carrier in position in said magazine, such that each component tape loaded into said tape guide is brought in said position for tape feeding by interaction between the component tape and feeding devices provided in said magazine.

6. The method according to claim 5, wherein said step of loading is performed prior to said step of arranging a plurality of component tape holders in said at least one carrier.

7. The method according to claim 5, wherein said step of loading is performed immediately following said step of arranging a plurality of component tape holders in said at least one carrier.

8. The method according to claim 5, wherein said step of loading is performed after said step of arranging said tape guide at said carrier.

9. The method according to claim 5, further comprising the sequential steps of detaching said mounted tape guide from said magazine; and removing said at least one carrier from said magazine, wherein said detached tape guides interconnected with said component tape holders arranged in said at least one carrier are removed with and carried by said carrier.

10. The method according to claim 1, wherein said step of placing comprises placing a plurality of carriers in said magazine, wherein said plurality of carriers are placed at selected positions in said magazine according to a predetermined component position scheme.

11. A system for handling component tapes, each component tape carrying components positioned in sequence, said system comprising at least one magazine from which components are supplied to be used in a mounting process of a component mounting machine;

a plurality of component tape holders, each component tape holder holding a component tape; and a plurality of carriers, each carrier being arrange to carry a plurality of component tape holders;

wherein said at least one magazine is arranged replaceably receive and support at least one of said carriers, such that said magazine is located with components for said mounting process.

12. The system according to claim 11, further comprising a plurality of tape guides, each tape guide being arranged for detachable mounting in said at least one magazine, said tape guides also being arranged for receiving and holding a component tape, and for bringing when mounted said held component tape in position for tape feeding by interaction between the component tape and feeding devices provided in said magazine, wherein each of said plurality of carriers are arranged for carrying a plurality of said tape guides.

13. The system according to claim 12, wherein said plurality of carriers comprise tape guide holders, said tape guide holders holding said plurality of tape guides.

14. The system according to claim 13, wherein said plurality of carriers are provided with compartments for holding said plurality of tape guides.

15. The system according to claim 12, wherein said plurality of tape guides are mounted to said plurality of carriers.

16. The system according to claim 15, wherein said plurality of tape guides are detachably mounted to said plurality of carriers.

17. The system according to claim 11, wherein said system comprises component tape holders of different designs and carriers of different designs, and wherein each of said plurality of carriers is arranged for receiving a plurality of component tape holders of a specific design.

18. The system according to claim 11, wherein said system comprises component tape holders of different designs, and wherein at least some of said plurality of carriers are arranged for receiving a plurality of component tape holders of different designs.

19. The system according to claim 15, wherein said plurality of tape guides is movably mounted for permitting mounting of said plurality of tape guides into said magazine.

20. An arrangement for ha handling component tapes, each component tape carrying components positioned in sequence, said arrangement comprising a plurality of component tape holders, each component tape holder holding a component tape;

a carrier arranged for carrying a plurality of component tape holders; and a plurality of tape guides, each tape guide being arranged for detachable mounting in a component magazine, said tape guides also being arranged for receiving and holding a component tape, and for bringing when mounted said held component tape in position for tape feeding by interaction between the component tape and feeding devices provided in said magazine, wherein said carrier is arranged for carrying a plurality of said tape guides.

21. The arrangement according to claim 20, wherein said carrier comprises at least one tape guide holder, said at least one tape guide holder holding said plurality of tape guides.

22. The arrangement according to claim 21, wherein said plurality of tape guides are mounted to said carrier.

23. The arrangement according to claim 22, wherein said plurality of tape guides are movably mounted for permitting mounting of said plurality of tape guides into said magazine.

24. The arrangement according to claim 22, wherein said plurality of tape guides are detachably mounted to said carrier.

25. The arrangement according to claim 20, wherein said system comprises component tape holders of different designs, and wherein said carrier is arranged for receiving a plurality of component tape holders of different designs.

26. The arrangement according to claim 25, wherein said carrier is provided with separate compartments for receiving said plurality of tape guides, wherein the width of the compartments is adjustable for receiving component tape holders of different widths.

* * * * *

UNITED STATES PATENT AND TRADEMARK OFFICE
CERTIFICATE OF CORRECTION

PATENT NO.    : 6,869,040 B2
DATED         : March 22, 2005
INVENTOR(S)   : Eskang It is certified that error appears in the above-identified patent and that said Letters Patent is hereby corrected as shown below:

Column 17,
Line 27, change "arrange" to -- arranged --
Line 29, change "is arranged" to -- is arranged to --
Line 31, change "located" to -- loaded --

Signed and Sealed this

Twenty-fourth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,869,040 B2
DATED : March 22, 2005
INVENTOR(S) : Eric Eskang

It is certified that error appears in the above-identified patent and that said Letters Patent is hereby corrected as shown below:

<u>Column 18,</u>
Line 15, change "ha handling" to -- handling --.

Signed and Sealed this

Twenty-sixth Day of July, 2005

JON W. DUDAS
*Director of the United States Patent and Trademark Office*